US012805385B2

(12) United States Patent
Yamagata et al.

(10) Patent No.: US 12,805,385 B2
(45) Date of Patent: Nov. 17, 2026

(54) HERMETIC PACKAGE DEVICE, AND DEVICE MODULE

(71) Applicant: Mitsubishi Electric Corporation, Tokyo (JP)

(72) Inventors: Yusuke Yamagata, Tokyo (JP); Takayuki Kato, Tokyo (JP); Tomohiro Maegawa, Tokyo (JP); Yoshinori Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 358 days.

(21) Appl. No.: 18/578,681

(22) PCT Filed: Oct. 5, 2021

(86) PCT No.: PCT/JP2021/036754
§ 371 (c)(1),
(2) Date: Jan. 11, 2024

(87) PCT Pub. No.: WO2023/058103
PCT Pub. Date: Apr. 13, 2023

(65) Prior Publication Data
US 2024/0387436 A1 Nov. 21, 2024

(51) Int. Cl.
*H01L 21/78* (2006.01)
*H10W 76/60* (2026.01)
(Continued)

(52) U.S. Cl.
CPC .......... *H10W 76/60* (2026.01); *H10W 42/121* (2026.01); *H10W 72/322* (2026.01);
(Continued)

(58) Field of Classification Search
CPC . H10W 76/60; H10W 42/121; H10W 72/322; H10W 72/332; H10W 72/344;
(Continued)

(56) References Cited

U.S. PATENT DOCUMENTS 6,479,320 B1 11/2002 Gooch
6,521,477 B1 2/2003 Gooch et al.
(Continued)

FOREIGN PATENT DOCUMENTS

JP H06-196579 A 7/1994
JP 2003-531475 A 10/2003
JP 2011-129726 A 6/2011

OTHER PUBLICATIONS

International Search Report issued in PCT/JP2021/036754; mailed Dec. 7, 2021.

*Primary Examiner* — Vu A Vu
(74) *Attorney, Agent, or Firm* — Studebaker Brackett PLLC

(57) ABSTRACT

In a conventional hermetic package device, a seal portion joining a device wafer and a lid wafer is provided along a crystal orientation of a semiconductor substrate. Thus, there has been an issue that a crack occurs on the device wafer, and circuits or wires arranged on the device wafer are broken or cut, respectively, to cause operation failure of a device. In a hermetic package device 100 according to the present disclosure, a device wafer 1 includes a protruding region 21 protruding from a lid wafer 2 in a planar view, a seal portion 10 has a polygonal shape in a planar view, and a side 11*a* of the polygonal shape facing the protruding region 21 is provided in a direction different from a crystal orientation of the device wafer 1.

15 Claims, 9 Drawing Sheets

(51) Int. Cl.

| | |
|---|---|
| *H10W 42/00* | (2026.01) |
| *H10W 72/30* | (2026.01) |
| *H10W 72/90* | (2026.01) |
| *H10W 76/12* | (2026.01) |
| *H10W 76/48* | (2026.01) |
| *H10W 90/00* | (2026.01) |

(52) U.S. Cl.
CPC ........ *H10W 72/332* (2026.01); *H10W 72/344* (2026.01); *H10W 72/352* (2026.01); *H10W 72/941* (2026.01); *H10W 76/161* (2026.01); *H10W 76/48* (2026.01); *H10W 90/731* (2026.01)

(58) Field of Classification Search
CPC ............. H10W 72/352; H10W 72/941; H10W 76/161; H10W 76/48; H10W 90/731; H10W 90/00; H10W 76/10
USPC .......................................................... 257/684
See application file for complete search history.

(56) References Cited

U.S. PATENT DOCUMENTS

| | | | | |
|---|---|---|---|---|
| 7,901,973 B2 * | 3/2011 | Yamamoto | .............. | H10F 77/50<br>438/110 |
| 8,018,030 B2 * | 9/2011 | Furusawa | ............. | H10W 42/00<br>257/E23.181 |
| 8,597,985 B1 * | 12/2013 | Chanchani | .......... | B81C 1/00904<br>438/110 |
| 8,866,289 B2 * | 10/2014 | Ebefors | ................. | H10W 76/60<br>257/710 |
| 10,160,638 B2 * | 12/2018 | Chu | ...................... | B81B 7/0038 |
| 10,167,190 B2 * | 1/2019 | Shkel | .................... | B81B 7/0074 |

* cited by examiner

HERMETIC PACKAGE DEVICE, AND DEVICE MODULE

FIELD

The present disclosure relates to a hermetic package device and a device module.

BACKGROUND

A micro electro mechanical system (MEMS) device that is a device in which a sensor, an actuator, and the like are integrated on a silicon substrate or the like by a microfabrication technique is practically used. Examples of the MEMS device include an infrared sensor, a gyroscope sensor, and an acceleration sensor.

Among the infrared sensors, an uncooled infrared sensor converts incident infrared rays into heat, as it is also referred to as a thermal sensor. Therefore, the uncooled infrared sensor includes a configuration for reading out change in temperature of an object as change of an electric signal, and has a heat insulation structure in which a sensor (imaging device) is thermally insulated from a base material in order to enhance detection sensitivity.

More specifically, the infrared sensor is arranged in a vacuum space sealed for enhancement of heat insulation property, namely, inside a vacuum package. At this time, it is known that silicon or ZnS that is low in oxygen content and is high in infrared transmittance is used or an antireflection film (AR coating: Anti-Reflection Coating) is formed, for a member serving as a lid of the vacuum package.

On the other hand, as a method of manufacturing the vacuum package, a wafer level package in which a device wafer provided with the MEMS device and a lid wafer facing the device wafer are joined in a vacuum atmosphere to form a plurality of vacuum packages has been proposed (for example, see PTL 1).

CITATION LIST

Patent Literature

[PTL 1] JP 2003-531475 A (paragraphs 0010 to 0015, and FIG. 1 to FIG. 4)

SUMMARY

Technical Problem

The hermetic package device configured by the wafer level package inevitably has a structure in which a bonding pad for electric connection provided on the device wafer is exposed from the lid wafer, and has a structure in which a bonding portion of the device wafer protrudes from the lid wafer. As a result, stress concentrates on a portion where a seal portion on a side from which the device wafer protrudes and the device wafer are in contact with each other.

Components such as devices, circuits, and wires provided on a semiconductor substrate are provided along a crystal orientation of the semiconductor substrate. In a conventional wafer level hermetic package having such a configuration, the seal portion joining the device wafer and the lid wafer is also arranged along the crystal orientation of the device wafer.

As a result, a direction in which the concentrated stress acts is coincident with a cleavage direction of the device semiconductor substrate. Therefore, there is an issue that a crack occurs on the device wafer, and the circuits or the wires arranged on the device wafer are accordingly broken or cut, respectively, to cause operation failure of the device.

The present disclosure discloses a technique for solving the above-described issues, and an object of the present disclosure is to prevent cracking of the device wafer and to provide a hermetic package device high in reliability.

Solution to Problem

A hermetic package device according to the present disclosure includes a device wafer including, on a mounting surface, a semiconductor circuit and a terminal for electrically connecting the semiconductor circuit and outside, a lid wafer arranged to face the mounting surface and a seal portion interposed between the device wafer and the lid wafer, and configured to form an airtight space of a vacuum atmosphere housing the semiconductor circuit between the device wafer and the lid wafer, wherein the device wafer includes a protruding region protruding from the lid wafer in a planar view, the terminal is provided in the protruding region, the seal portion has a polygonal shape in a planar view, and a side of the polygonal shape facing the protruding region is provided in a direction different from a crystal orientation of the device wafer.

A device module according to the present disclosure includes a hermetic package device including a device wafer including, on a mounting surface, a semiconductor circuit and a terminal for electrically connecting the semiconductor circuit and outside, a lid wafer arranged to face the mounting surface and a seal portion interposed between the device wafer and the lid wafer, and configured to form an airtight space of a vacuum atmosphere housing the semiconductor circuit between the device wafer and the lid wafer, wherein the device wafer includes a protruding region protruding from the lid wafer in a planar view, the terminal is provided in the protruding region, the seal portion has a polygonal shape in a planar view, and a side of the polygonal shape facing the protruding region is provided in a direction different from a crystal orientation of the device wafer, a circuit substrate, the hermetic package device mounted on the circuit substrate and an electronic component mounted on the circuit substrate and electrically connected to the terminal.

Advantageous Effects of Invention

According to the present disclosure, the stress at the portion where the seal portion and the device wafer are in contact with each other can be relaxed. This makes it possible to prevent cracking of the device wafer, and to provide a hermetic package device or a device module high in reliability.

DESCRIPTION OF EMBODIMENTS

Figure 1:
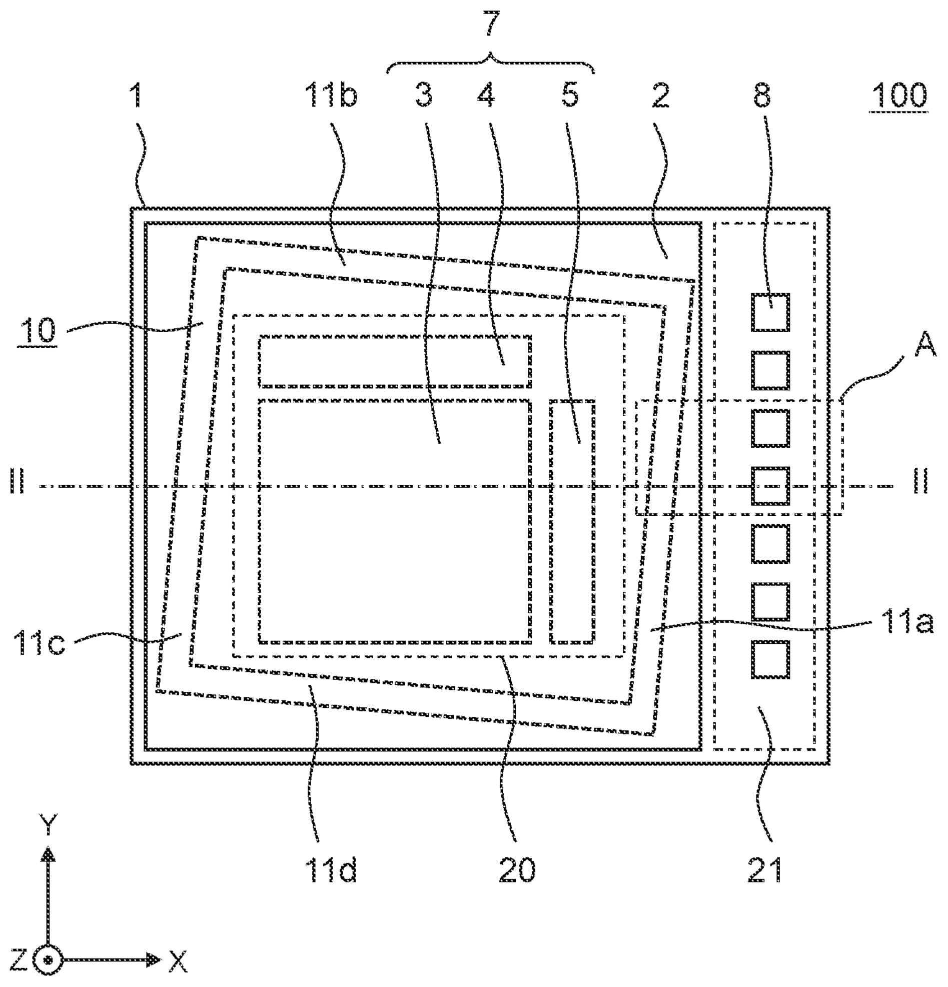
FIG. 1 is a plan view in which a lid wafer portion of the hermetic package device according to Embodiment 1 is made transparent.

Hermetic package devices and device modules according to embodiments of the present disclosure are described below with reference to the drawings. The same or corresponding components are denoted by the same reference numerals, and repetitive description is omitted in some cases. This is common throughout the entire text of the specification.

Embodiment 1

Figure 2:
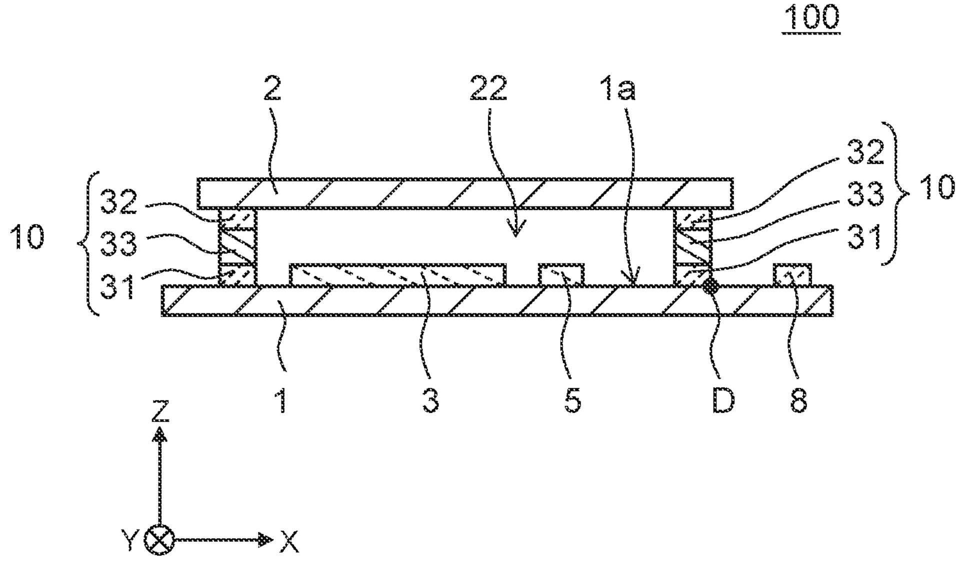
FIG. 2 is a cross-sectional view corresponding to line II-II in FIG. 1.
Figure 3:
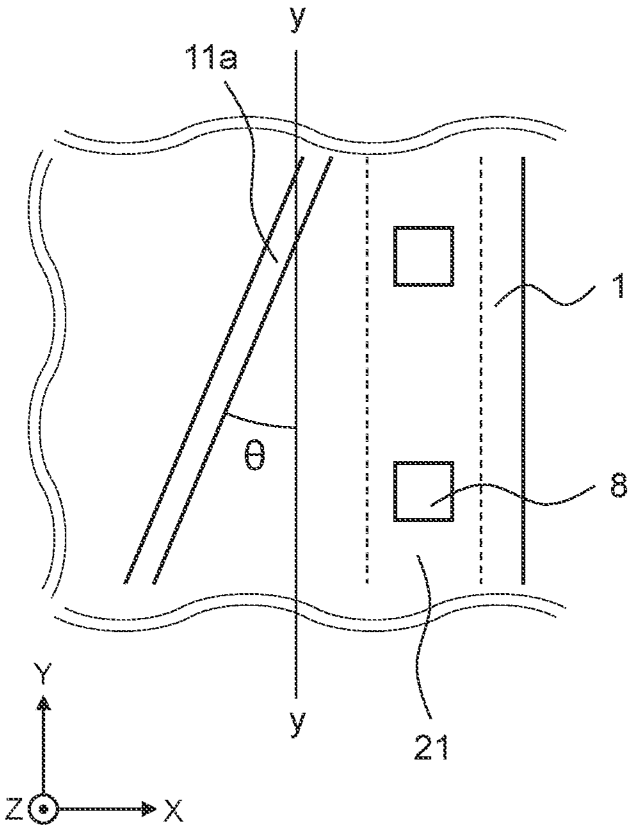
FIG. 3 is a partial enlarged view illustrating a region A in FIG. 1 in an enlarged manner.

A hermetic package device 100 according to Embodiment 1 is described with reference to FIG. 1 to FIG. 3. FIG. 1 is a plan view in which a lid wafer portion of the hermetic package device is made transparent. FIG. 2 is a cross-sectional view corresponding to line II-II in FIG. 1. FIG. 3 is a partial enlarged view illustrating a region A in FIG. 1 in an enlarged manner.

First, a basic configuration of the hermetic package device is described.

A silicon substrate is generally processed such that a crystal orientation thereof is directed to two directions parallel to a substrate surface and orthogonal to each other. A device wafer 1 and a lid wafer 2 are each manufactured by processing a silicon substrate. In FIG. 1 to FIG. 9, and FIG. 11, the device wafer 1 and the lid wafer 2 are arranged such that a crystal orientation of each of the device wafer 1 and the lid wafer 2 is parallel to an X axis or a Y axis illustrated in the drawing. An outer shape of each of the device wafer 1 and the lid wafer 2 is a rectangular shape parallel to the X axis or the Y axis.

As illustrated in FIG. 1 and FIG. 2, in a planar view, namely, in a case of being viewed from a Z axis direction, the device wafer 1 and the lid wafer 2 are joined by a seal portion 10 such that a part of the device wafer 1 protrudes from the lid wafer 2 and flat surfaces thereof face each other in parallel.

The seal portion 10 includes a first base layer 31 pattern-formed on a mounting surface 1*a* of the device wafer 1, a second base layer 32 pattern-formed on a surface of the lid wafer 2 facing the mounting surface 1*a*, and a seal material layer 33 that is interposed between the first base layer 31 and the second base layer 32 to fill a gap therebetween. The first base layer 31 and the second base layer 32 are each continuously and seamlessly pattern-formed, and are also referred to as a sealing ring.

The seal material layer 33 is made of a solder material. However, the solder material is low in wettability to the surface (mounting surface 1*a*) of the device wafer 1 and to the surface of the lid wafer 2, and it is difficult for the solder material as is to join the device wafer 1 and the lid wafer 2. Therefore, the first base layer 31 and the second base layer 32 are each made of a material excellent in wettability with the solder material and excellent in adhesiveness with the corresponding wafer so as to function as intermediate layers for bonding the wafers and the seal material layer 33.

As such materials, for example, the material of the seal material layer 33 is lead-free solder, and the material of the first base layer 31 and the second base layer 32 is nickel; however, the materials are not limited thereto, and optional materials are selectable. However, high-temperature solder and AuSn solder are high in environmental load and price. Therefore, lead-free solder is suitable.

By the seal portion 10 configured as described above, an airtight space 22 surrounded by the device wafer 1, the lid wafer 2, and the seal portion 10 is maintained in a vacuum atmosphere. To ensure a vacuum volume, the seal portion 10 is formed to have a thickness of 50 μm to 150 μm, and has a thickness of 100 μM in the present embodiment. Although the inside of the airtight space 22 is the vacuum atmosphere, the vacuum atmosphere does not indicate a completed vacuum state, and may have a vacuum degree necessary to maintain heat insulation property.

An infrared imaging device 3, a scan circuit 4, and a readout circuit 5 are arranged in a region 20 inside the seal portion 10 on the mounting surface 1*a* of the device wafer 1. The MEMS and the semiconductor devices including the imaging device 3, the scan circuit 4, and the readout circuit 5 arranged in the region 20 are referred to as a semiconductor circuit 7. The semiconductor circuit 7 is arranged inside the airtight space 22 maintained in a vacuum atmosphere excellent in heat insulation property, which enhances reliability of the infrared sensor.

An unillustrated gas adsorbent referred to as a getter to maintain the vacuum degree is provided on a portion surrounded by the second base layer 32 on the lid wafer 2. Further, a recess for increasing the vacuum volume is provided in some cases. Furthermore, an antireflection film referred to as an AR coating for improving infrared transmittance is provided on an outer surface of the lid wafer 2 in some cases.

In a planar view, namely, in a case of being viewed from the Z axis direction, the device wafer 1 includes a region protruding from the lid wafer 2, and the protruding region is referred to as a protruding region 21. A plurality of terminals 8 (bonding pads) for electrically connecting the semiconductor circuit 7 and the outside are provided on the mounting surface 1*a* of the protruding region 21. The terminals 8 and the semiconductor circuit 7 are electrically connected through unillustrated wires provided on the mounting surface 1*a*.

The terminals 8 configured as described above are electrically connected to an unillustrated circuit substrate and the like through wires and the like. As a result, the connected components function as a device module 200 (FIG. 9 and FIG. 10) described below.

A characteristic configuration of the hermetic package device 100 according to the present disclosure is described on the premise of the above-described configuration. As illustrated in FIG. 1, in a planar view, namely, in a case of being viewed from the Z axis direction, the seal portion 10 has a polygonal shape including sides 11*a*, 11*b*, 11*c*, and 11*d*. As described above, the crystal orientation of each of the device wafer 1 and the lid wafer 2 is parallel to the X axis or the Y axis. On the other hand, the sides of the seal portion 10 are not parallel to the X axis and the Y axis, and are provided in directions different from the crystal orientation of each of the device wafer 1 and the lid wafer 2.

An auxiliary line y-y illustrated in FIG. 3 is a straight line parallel to the Y axis. The side 11*a* facing the protruding region 21 and the auxiliary line y-y form an angle θ. The angle θ is neither 0 degrees nor 90 degrees.

Next, effects by a heretic package sensor according to Embodiment 1 of the present disclosure are described.

A point D in FIG. 2 is a contact point between the device wafer 1 and the seal portion 10, on a side on which the device wafer 1 protrudes from the lid wafer 2.

The hermetic package device 100 is once heated to a high temperature in the vacuum atmosphere to melt the solder material of the seal material layer 33, and is then lowered in temperature. As a result, the airtight space 22 is formed between the device wafer 1 and the lid wafer 2. A linear expansion coefficient of the solder used for the seal material layer 33 is greater than a linear expansion coefficient of silicon used for the device wafer 1 and the lid wafer 2. Therefore, in a normal use state, residual stress in a direction from the point D to the lid wafer (+Z direction) and in a direction from the point D to the semiconductor circuit (−X direction) acts on the point D.

Figure 11:
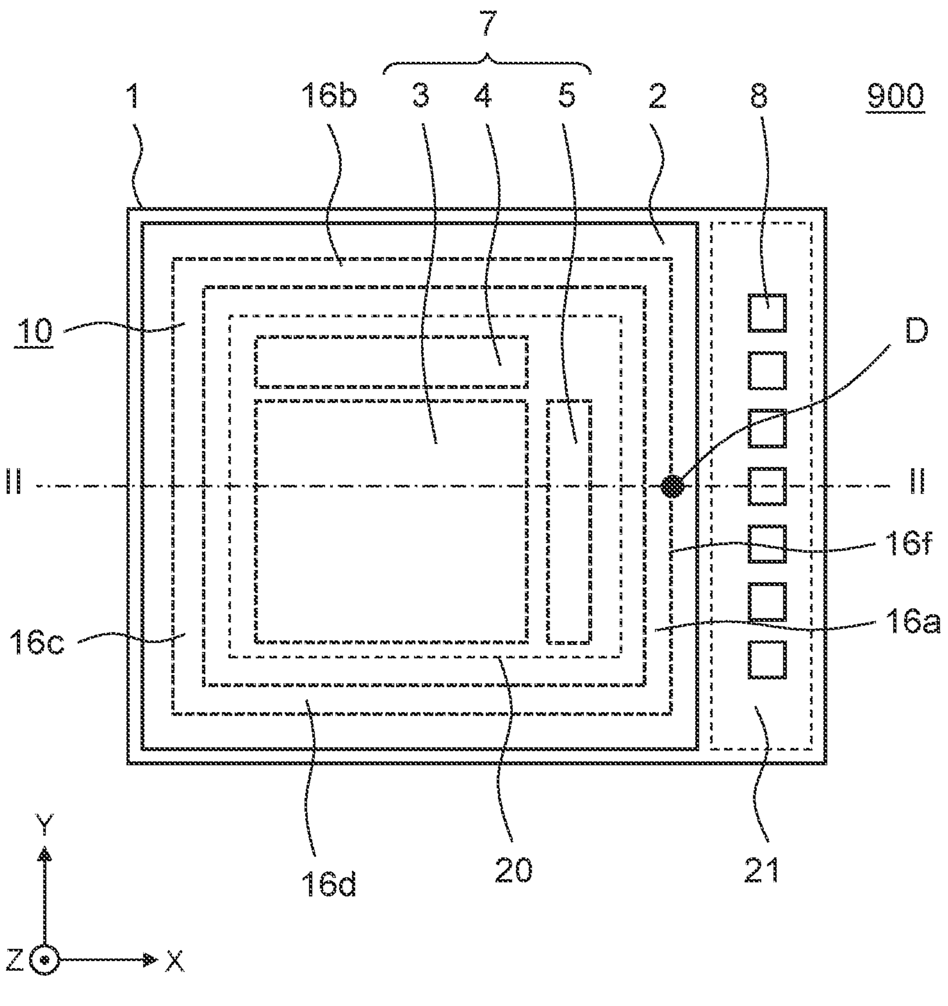
FIG. 11 is a plan view in which a lid wafer portion of a conventional hermetic package device is made transparent.

FIG. 11 is a plan view in which a lid wafer portion of a conventional hermetic package device 900 is made transparent. In the conventional hermetic package device, components such as devices, circuits, and wires provided on a semiconductor substrate are provided along a crystal orientation of the semiconductor substrate. Further, the seal portion 10 joining a device wafer and a lid wafer is also arranged along a crystal orientation of the device wafer.

Description is given with reference to FIG. 2 as a cross-sectional view corresponding to line II-II in FIG. 11. Residual stress acts on an entire end 16*f* of a side 16*a* on a right side in the drawing in a manner similar to the residual stress acting on the point D. In other words, the residual stress acting on the side 16*a* concentrates and acts along the end 16*f*. The end 16*f* is parallel to the Y axis in the drawing, and is coincident with a cleavage direction of the device wafer, namely, the crystal orientation. Therefore, there is an issue that a crack occurs on the device wafer, and the circuits or the wires arranged on the device wafer are accordingly broken or cut, respectively, to cause operation failure of the device.

In contrast, in the hermetic package device 100 according to Embodiment 1 of the present disclosure, the side 11*a* is arranged so as to be inclined by the angle θ relative to the crystal orientation of the device wafer 1. In other words, the direction in which the concentrated stress acts is deviated by the angle θ from the crystal orientation, and stress concentration is relaxed. This makes it possible to avoid operation failure of the device caused by cracking of the device wafer 1, breakage of the circuits or cutting of the wires arranged on the device wafer 1. As a result, the hermetic package device high in reliability is obtainable.

In our reliability test, in a case where the angle θ was zero as in the conventional hermetic package, namely, in a case where the side 11*a* of the seal portion 10 was parallel to the crystal orientation of the device wafer 1, a crack occurred at the point D as the contact point between the device wafer 1 and the seal portion 10, and accordingly, airtightness of the airtight space 22 was lost and operation failure occurred on the hermetic package device 100. However, in a case where the angle θ was increased from zero, operation failure did not occur in the reliability test.

On the other hand, the semiconductor circuit 7, the terminals 8, and the like are arranged such that outer shapes thereof are parallel to the crystal orientation. Therefore, an area where the seal portion 10 is installed is increased in the hermetic package device, as the angle θ is set to a larger value, which causes an issue that the device size is increased. Influence by the angle θ is increased, as the area of the semiconductor circuit 7 is increased. Therefore, it is necessary to select the angle θ so that the size of the hermetic package device is within an allowable range. Therefore, the angle θ is preferably greater than 0 degrees and 5 degrees or less, and more preferably 1 degree or more and 3 degrees or less.

The sealing ring of the device wafer and the lid wafer according to the present embodiment is formed by electrolytic nickel plating. A width of the sealing ring by the electrolytic nickel plating is formed using an existing photolithography technique, and the optional angle θ can be formed by a pattern of a photomask.

As described above, the hermetic package device 100 according to Embodiment 1 includes the device wafer 1 including, on the mounting surface 1*a*, the semiconductor circuit 7 and the terminals 8 electrically connecting the semiconductor circuit 7 and the outside, the lid wafer 2 arranged to face the mounting surface 1*a*, and the seal portion 10 interposed between the device wafer 1 and the lid wafer 2, and configured to form the airtight space 22 of the vacuum atmosphere housing the semiconductor circuit 7 between the device wafer 1 and the lid wafer 2.

The device wafer 1 includes the protruding region 21 protruding from the lid wafer 2 in a planar view. The terminals 8 are provided in the protruding region 21. The seal portion 10 has a polygonal shape in a planar view, and the side 11*a* facing the protruding region 21 is provided in a direction different from the crystal orientation of the device wafer 1.

Further, the angle θ formed by the side 11*a* facing the protruding region 21 and the crystal orientation of the device wafer 1 is desirably greater than 0 degrees and 5 degrees or less, and further desirably 1 degree or more and 3 degrees or less.

According to such a configuration, since the side 11*a* is arranged so as to be inclined by the angle θ relative to the crystal orientation of the device wafer 1, the direction in which the concentrated stress acts is deviated by the angle θ from the crystal orientation. As a result, the stress concentration is relaxed, which makes it possible to avoid operation failure of the device caused by cracking of the device wafer, breakage of the circuits or cutting of the wires arranged on the device wafer 1. Thus, the hermetic package device high in reliability is obtainable.

Embodiment 2

A hermetic package device 110 according to Embodiment 2 is described. In Embodiment 1, all of the sides of the seal portion 10 are configured so as not to be parallel to the crystal orientation of the device wafer 1. In Embodiment 2, the side 11*a* of the seal portion 10 facing the protruding region 21 is configured so as not to be parallel to the crystal orientation, and the other sides are configured so as to be parallel to the crystal orientation.

Figure 4:
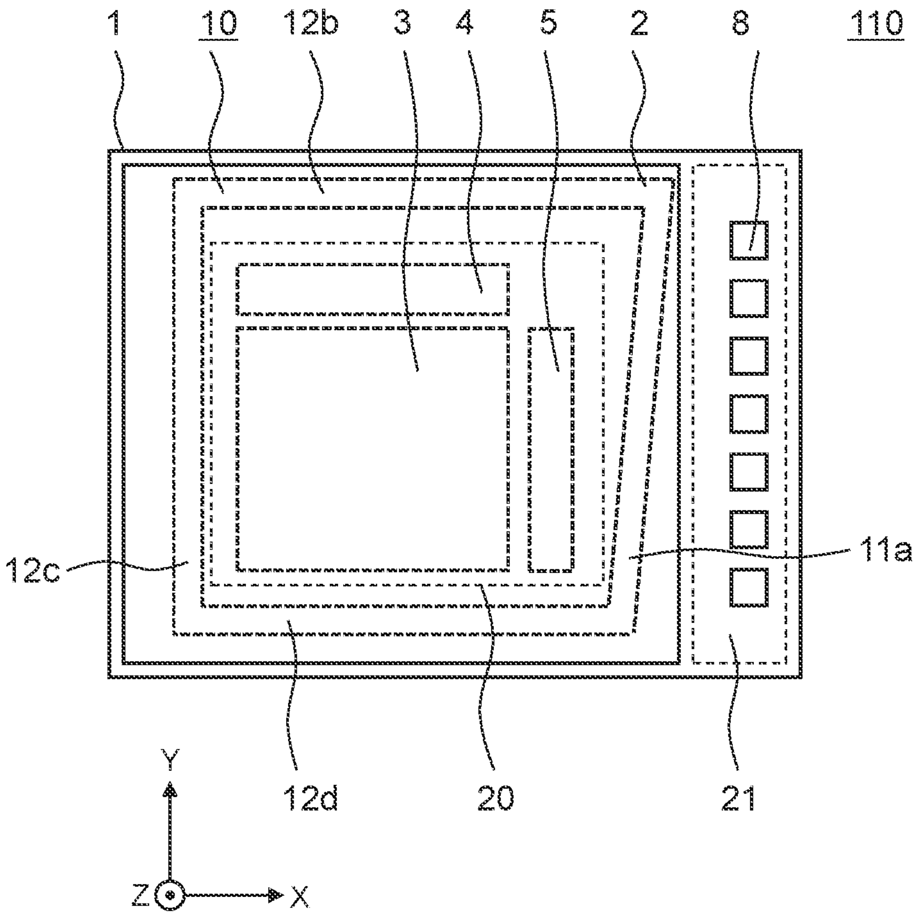
FIG. 4 is a plan view in which a lid wafer portion of the hermetic package device according to Embodiment 2 is made transparent.

FIG. 4 is a plan view in which a lid wafer portion of the hermetic package device 110 according to Embodiment 2 is made transparent.

The seal portion 10 of the hermetic package device 110 according to Embodiment 2 includes sides 11*a*, 12*b*, 12*c*, and 12*d*. Materials, cross-sectional structures, and the like of the sides 12*b*. 12*c*, and 12*d* are the same as the materials, the cross-sectional structures, and the like of the sides 11*a*, 11*b*, 11*c*, and 11*d*.

The sides 12*b*. 12*c*, and 12*d* respectively correspond to the sides 11*b*, 11*c*, and 11*d* according to Embodiment 1, but are arranged parallel to the X axis or the Y axis as in the conventional hermetic package device. In other words, the sides 12*b*, 12*c*, and 12*d* are arranged parallel to the crystal orientation of the device wafer 1. The device wafer 1 does not protrude from the lid wafer 2 at portions facing to the sides 12*b*. 12*c*, and 12*d*, and the sides 12*b*. 12*c*, and 12*d* do not face the protruding region.

The wires electrically connecting the semiconductor circuit 7 on the device wafer 1 and the outside are arranged so as not to intersect with the seal portion 10 at a portion other than the side 11*a* facing the protruding region 21.

In other words, in Embodiment 2, the sides 12*b*, 12*c*, and 12*d* of the seal portion 10 not facing the protruding region 21 with no concern of operation failure of the device caused by stress concentration, cracking of the device wafer 1, breakage of the circuits or cutting of the wires arranged on the device wafer 1 are provided in the direction same as the crystal orientation of the device wafer 1 as in the conventional hermetic package.

The other portions are similar to Embodiment 1, and description thereof is omitted. Embodiment 2 also achieves a stress relaxing effect as in Embodiment 1. Further, in Embodiment 2, the size of the hermetic package device 110 can be reduced as compared with Embodiment 1. Embodiment 2 is effective for a case where all of the sides of the sealing ring cannot be inclined and the size of the hermetic package device 110 cannot be increased due to restriction of device layout.

Note that the side of the seal portion 10 facing the protruding region 21 may not be a single side not parallel to the crystal orientation.

Figure 5:
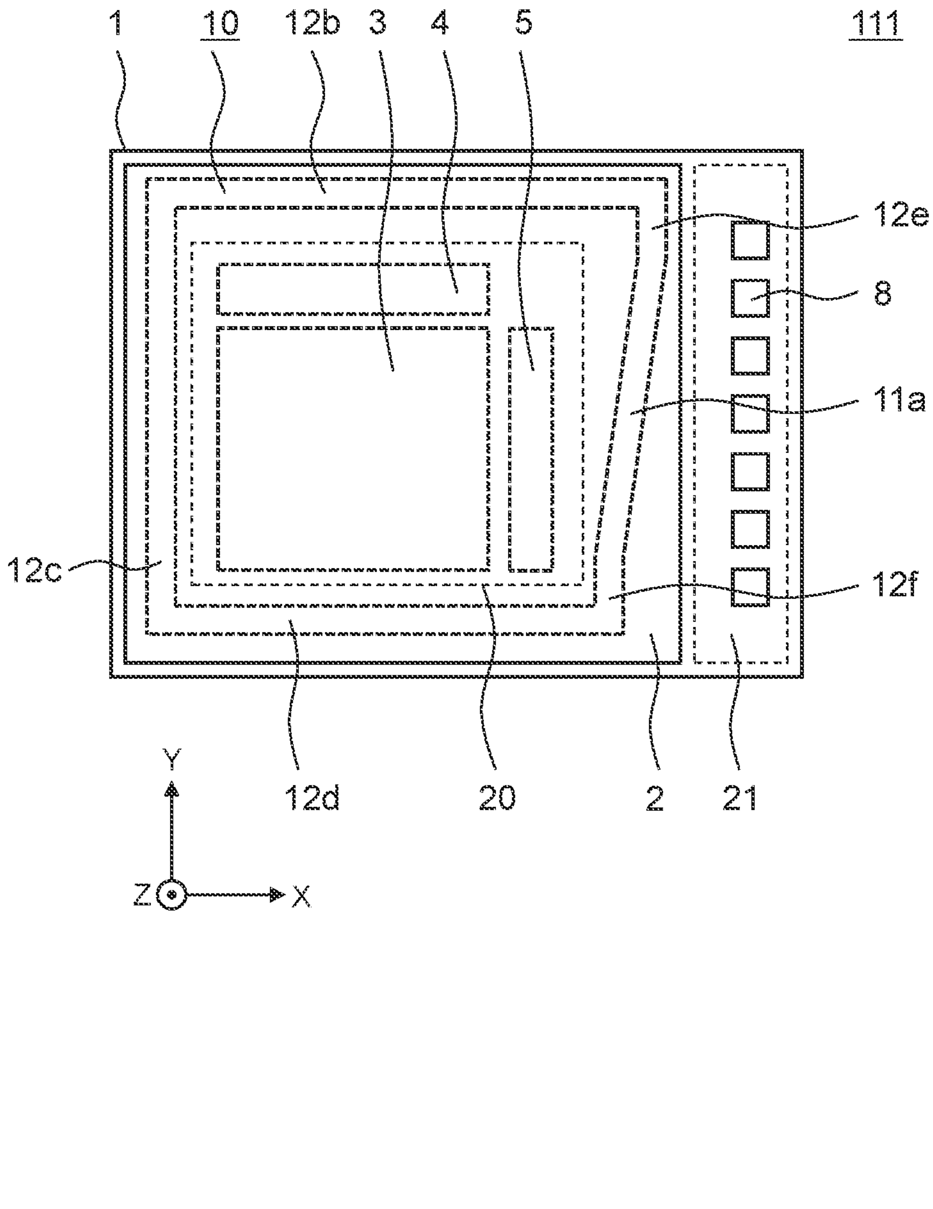
FIG. 5 is a plan view in which a lid wafer portion of a hermetic package device according to a modification of Embodiment 2 is made transparent.

FIG. 5 is a plan view in which a lid wafer portion of a hermetic package device 111 according to a modification of Embodiment 2 is made transparent. Unlike the hermetic package device 110, the side of the seal portion 10 facing the protruding region 21 in the hermetic package device 11 includes the side 11*a* not parallel to the crystal orientation, and sides 12*e* and 12*f* that are continuous with the side 11*a* and are parallel to the crystal orientation. A length of the side 11*a* is longer than a length of each of the sides 12*e* and 12*f*.

It is noted that, even when the side of the seal portion 10 facing the protruding region 21 partially includes a portion parallel to the crystal orientation as described above, configuring most part of the side not to be parallel to the crystal orientation makes it possible to exert a certain effect of relaxing stress concentration.

Embodiment 3

A hermetic package device 120 according to Embodiment 3 is described with reference to FIG. 6 and FIG. 7.

In Embodiment 1, the side of the seal portion 10 facing the protruding region 21 is the single side 11*a*. In contrast, in Embodiment 3, the side of the seal portion 10 facing the protruding region 21 includes a plurality of sides, and the plurality of sides are arranged in a zigzag manner.

Figure 6:
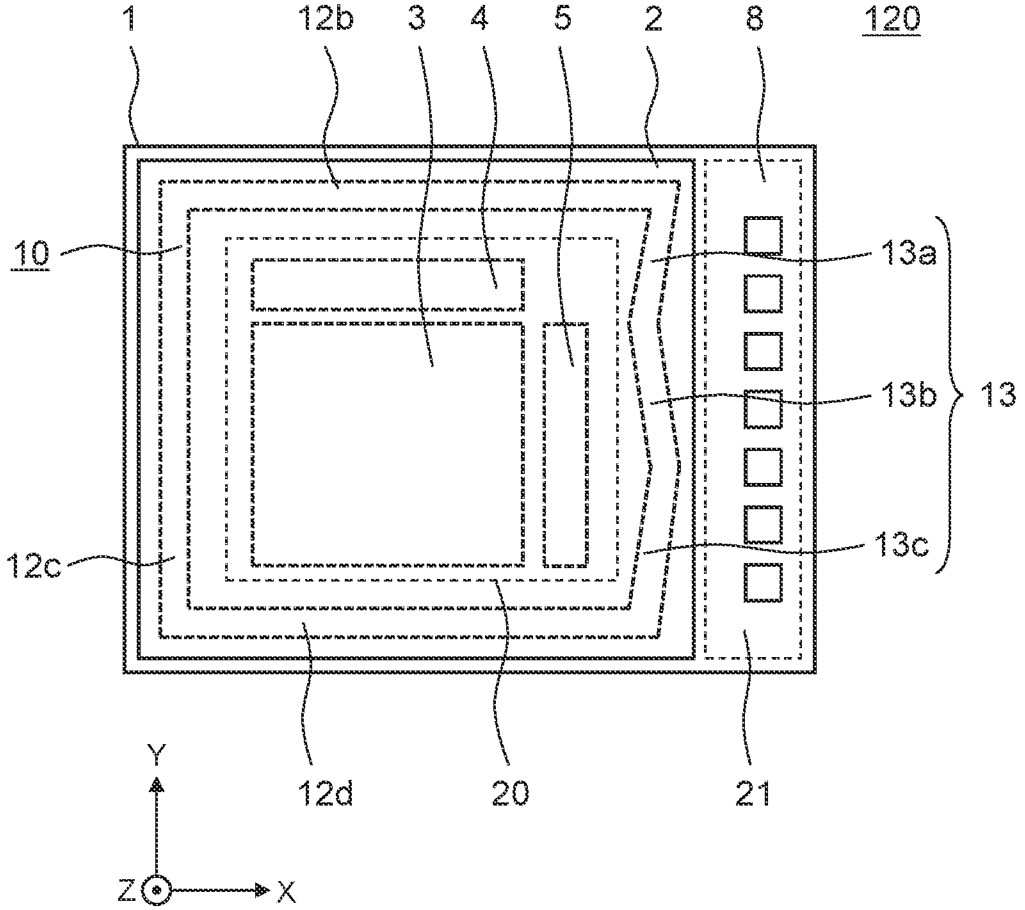
FIG. 6 is a plan view in which a lid wafer portion of the hermetic package device according to Embodiment 3 is made transparent.

FIG. 6 is a plan view in which a lid wafer portion of the hermetic package device 120 according to Embodiment 3 is made transparent. The seal portion 10 of the hermetic package device 120 according to Embodiment 3 includes the sides 12*b*, 12*c*, and 12*d*, and a side 13 facing the protruding region 21. The side 13 includes a plurality of sides 13*a*. 13*b*, and 13*c* that are continuous and arranged in a zigzag manner. The same material and the same cross-sectional structure are used for the sides 12*b*. 12*c*, and 12*d*, and the side 13. The side 13 is a side of the seal portion 10 facing the protruding region 21 as the side 11*a*, and is a continuous side not parallel to the crystal orientation and including bent points such that the sides 13*a*. 13*b*, and 13*c* are arranged not to parallel to the crystal orientation (X direction and Y direction on sheet surface).

Figure 7:
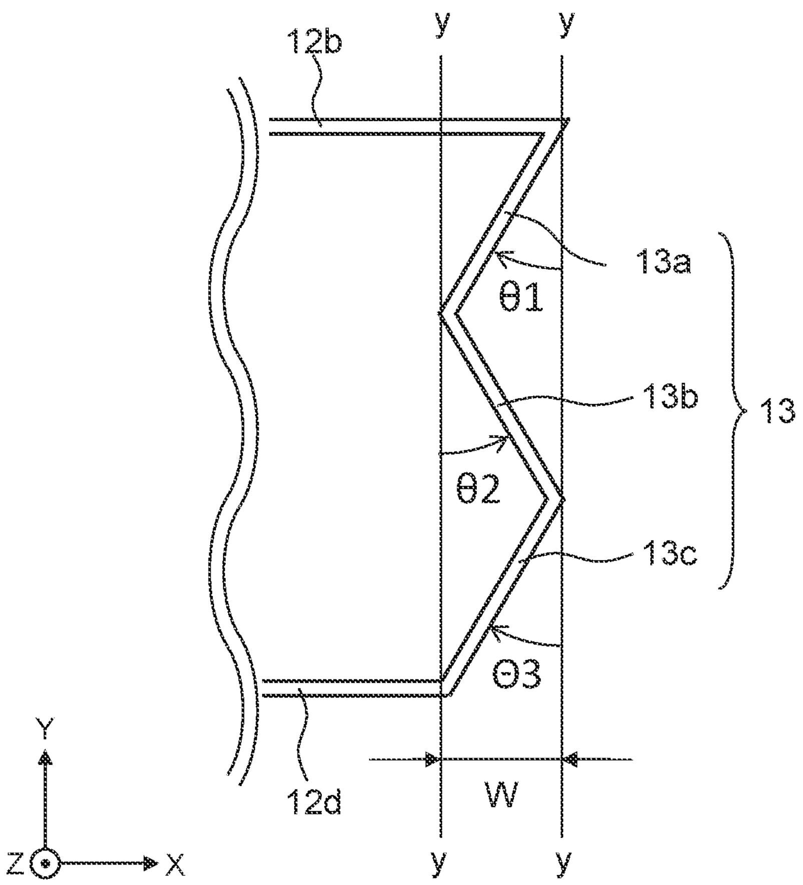
FIG. 7 is a diagram illustrating relationship between the side 13 and the crystal orientation of the device wafer 1.

FIG. 7 is a diagram illustrating relationship between the side 13 and the crystal orientation of the device wafer 1. In FIG. 7, a portion other than a portion necessary for description is not illustrated and is omitted. Two auxiliary lines y-y illustrated in FIG. 7 are straight lines parallel to the Y axis. In other words, the auxiliary lines y-y indicate the direction same as the crystal orientation.

The sides 13*a*. 13*b*, and 13*c* are arranged so as not to be parallel to the crystal orientation (X direction and Y direction on sheet surface). Angles formed by the sides 11*a*, 11*b*, and 11*c* and the auxiliary lines y-y are θ1, θ2, and θ3, respectively. Absolute values of the angles θ1, θ2, and θ3 may be equal to one another or different from one another.

Each of the angles θ1 and θ3 is measured in a clockwise direction as viewed from the auxiliary lines y-y, whereas the angle θ2 is measured in a counterclockwise direction as viewed from the auxiliary lines y-y. In other words, it can be said that signs of the angles θ1 and θ3 are different from a sign of the angle θ2, or the angles θ1, θ2, and θ3 are zigzag to the auxiliary lines y-y (crystal orientation).

In FIG. 7. W denotes a width occupied by the side 13 in the X axis direction. For example, a case where a length of each of the sides 13*a*. 13*b*, and 13*c* in Embodiment 3 is ⅓ of the length of the side 11*a* in Embodiment 1, and the angle θ in Embodiment 1 and the angles θ1. θ2, and θ3 in Embodiment 3 are each set to the same value is considered. In this case, the width W can be made ⅓ of a width occupied by the side 11*a* in the X axis direction in Embodiment 1.

In other words, the side of the seal portion 10 facing the protruding region 21 includes the plurality of sides arranged in a zigzag manner as illustrated in Embodiment 3, which makes it possible to suppress increase in size of the hermetic package device.

Description of the other portions is omitted.

As described above, the hermetic package device 120 according to Embodiment 3 includes the device wafer 1 including, on the mounting surface 1*a*, the semiconductor circuit 7 and the terminals 8 electrically connecting the semiconductor circuit 7 and the outside, the lid wafer 2 arranged to face the mounting surface 1*a*, and the seal portion 10 interposed between the device wafer 1 and the lid wafer 2, and configured to form the airtight space 22 of the vacuum atmosphere housing the semiconductor circuit 7 between the device wafer 1 and the lid wafer 2.

The device wafer 1 includes the protruding region 21 protruding from the lid wafer 2 in a planar view. The terminals 8 are provided in the protruding region 21. The seal portion 10 has a polygonal shape in a planar view, and includes the side 13*a* facing the protruding region 21 provided in a direction different from the crystal orientation of the device wafer 1. In Embodiment 3, the side 13 includes the sides 13*a*. 13*b*, and 13*c* arranged in a zigzag manner.

According to such a configuration, effects similar to the effects by the hermetic package device 100 according to Embodiment 1 are achievable. In addition, in the hermetic package device 120 according to Embodiment 3, the side of the seal portion 10 facing the protruding region 21 includes the plurality of sides arranged in a zigzag manner. This achieves the effect of suppressing increase in size of the hermetic package device.

Note that, in Embodiment 3, the side of the seal portion 10 facing the protruding region 21 is divided into three sides, and the three sides are arranged in a zigzag manner; however, the side may be divided into two sides, and the two sides may be arranged in a V-shape. Alternatively, the number of divisions may be four or more, and lengths of the divided sides may not be equal to one another. Further, even when a side arranged parallel to the crystal orientation is provided together with the plurality of sides arranged in a zigzag manner or in a V-shape, it is possible to suppress increase in size of the hermetic package device.

Embodiment 4

A hermetic package device 130 according to Embodiment 4 is described with reference to FIG. 8. In Embodiments 1 to 3, the case where the protruding region 21 is provided on one side of the hermetic package device is described, whereas in Embodiment 4, a case where protruding regions are provided on two sides of the hermetic package device is described.

Figure 8:
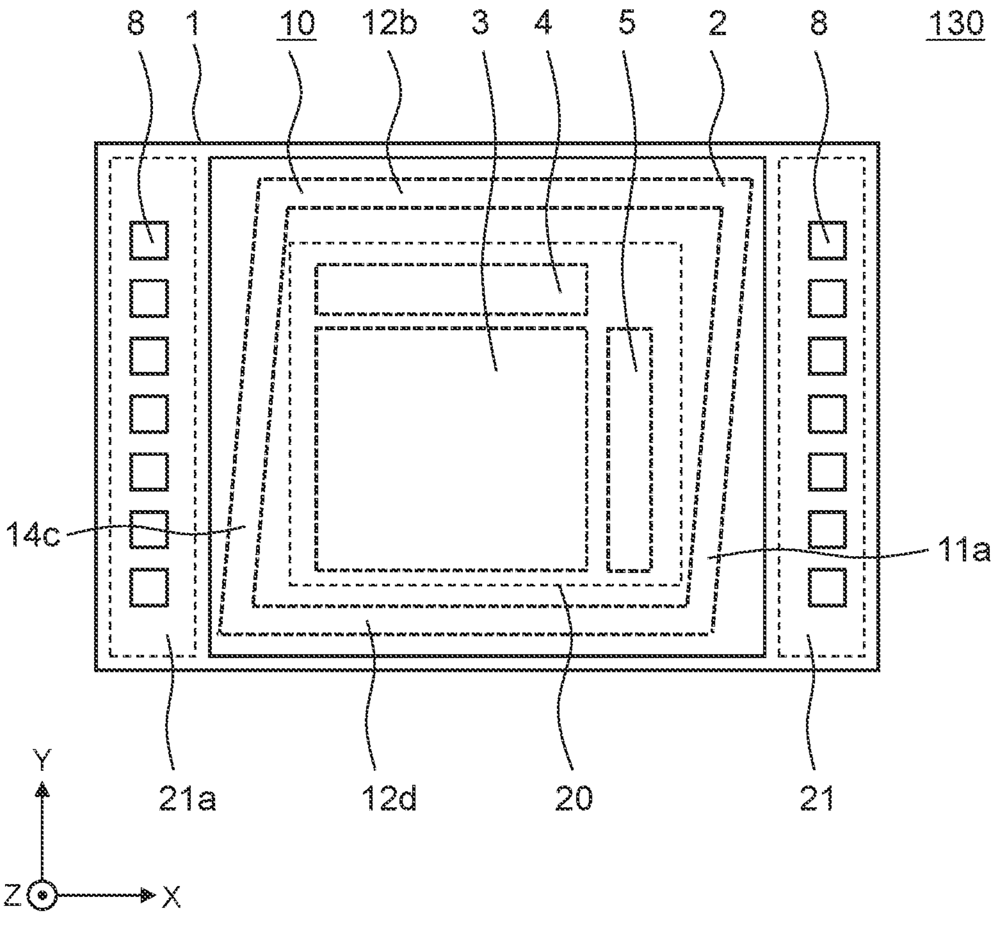
FIG. 8 is a plan view in which a lid wafer portion of the hermetic package device according to Embodiment 4 is made transparent.

FIG. 8 is a plan view in which a lid wafer portion of the hermetic package device 130 according to Embodiment 4 is made transparent.

In Embodiment 4, the device wafer 1 includes portions protruding from the lid wafer 2 at two positions. One of the portions is the protruding region 21 as in Embodiment 1, and the other portion is a protruding region 21*a*.

The protruding region 21*a* as a second protruding region is arranged on a side opposite to the protruding region 21 as a first protruding region, with the airtight space 22 in between. The plurality of terminals 8 (bonding pads) electrically connected to the imaging device 3, the scan circuit 4, and the readout circuit 5 through unillustrated wires are also provided on the mounting surface 1*a* of the protruding region 21*a*.

The seal portion 10 according to Embodiment 4 has a polygonal shape including sides 11*a*. 12*b*. 14*c*, and 12*d*. The side 11*a* faces the protruding region 21, and is provided in a direction different from the crystal orientation. The sides 12*b* and 12*d* are provided in the direction same as the crystal orientation.

The side 14*c* faces the protruding region 21*a*, and is provided in a direction different from the crystal orientation of the device wafer 1. A material, a cross-sectional structure, and the like of the side 14*c* are the same as the materials, the cross-sectional structures, and the like of the sides 11*a*, 12*b*, and 12*d*. Description of the other portions is omitted.

The hermetic package device 130 according to Embodiment 4 configured as described above also achieves the stress relaxing effect in a manner similar to Embodiment 1.

Note that the first protruding region 21 and the second protruding region 21*a* are arranged on the sides opposite to each other with the airtight space 22 in between; however, the first protruding region 21 and the second protruding region 21*a* may be arranged adjacent to each other, for example, on the side 11*a* and the side 12*b*. Further, the protruding regions may be arranged on three or more sides.

Embodiment 5

Figure 9:
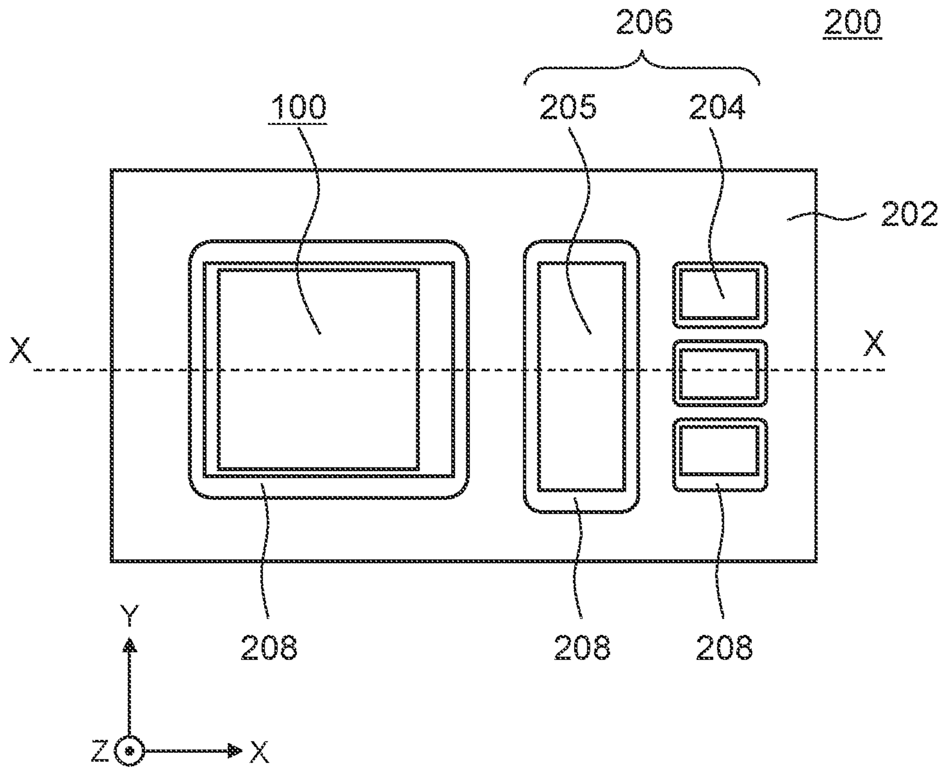
FIG. 9 is a plan view of the device module according to Embodiment 5.
Figure 10:
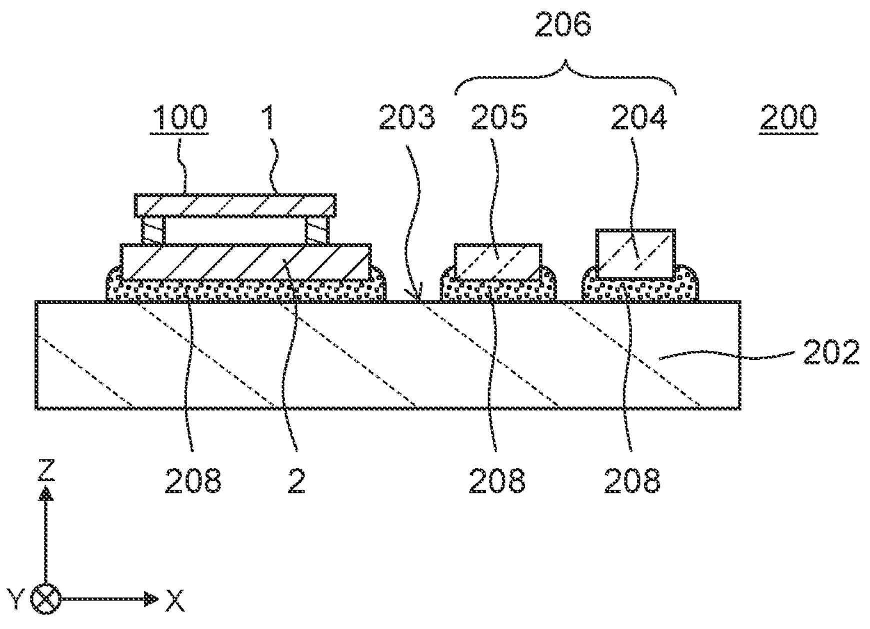
FIG. 10 is a cross-sectional view corresponding to line X-X in FIG. 9.

In Embodiment 5, a device module in which any of the hermetic package devices described in Embodiments 1 to 4 is mounted with other electronic components on a circuit substrate is described. FIG. 9 and FIG. 10 are diagrams for describing a configuration of the device module according to Embodiment 5. FIG. 9 is a plan view of the device module according to Embodiment 5, and FIG. 10 is a cross-sectional view corresponding to line X-X in FIG. 9.

The configuration of the hermetic package device portion is described using the hermetic package device 100; however, the configuration of the hermetic package device portion is similar to any of Embodiments 1 to 4, and the hermetic package device 100 may be replaced with any of the hermetic package devices 110, 111, 120, and 130. Moreover, description of similar portions is omitted, and FIG. 1 to FIG. 8 are referred to.

As illustrated in FIG. 9 and FIG. 10, a device module 200 according to Embodiment 5 is obtained by mounting the hermetic package device 100, and electronic components 206 including components 204 such as a resistor and a capacitor and a semiconductor device 205, on a mounting surface 203 of a circuit substrate 202.

The mounted electronic components are electrically connected to the terminals 8 of the hermetic package device 100 by unillustrated wire bonding and the like, to form the device module 200. In Embodiment 5, the hermetic package device 100 and the electronic components 206 are fixed to the circuit substrate 202 with thermosetting conductive adhesives 208. Although not illustrated, other components, a cover, and the like necessary for configuring the device module 200 are further provided.

The device module 200 according to Embodiment 5 includes the hermetic package device described in any of Embodiments 1 to 4, and is robust to vibration and impact. For example, in a case of using the hermetic package device 100 functioning as an infrared sensor, an infrared sensor that is robust to vibration and impact, prevents cracking of the device wafer, and is high in reliability is obtainable.

The present disclosure is not limited to the above-described embodiments, and includes various modifications. For example, the above-described embodiments are described in detail for facilitating understanding of the present disclosure, and are not necessarily limited to the embodiments including all of the described configurations.

Further, a part of the configuration of one embodiment can be replaced with the configuration of the other embodiment, and the configuration of one embodiment can be added to the configuration of the other embodiment. Furthermore, addition, deletion, and replacement of the other configuration can be performed on a part of the configuration of each of the embodiments.

REFERENCE SIGNS LIST

- 1 device wafer, 1*a* mounting surface, 2 lid wafer, 3 imaging device, 4 scan circuit,
- 5 readout circuit, 7 semiconductor circuit, 8 terminals (bonding pad), 10 seal portion,
- 11*a*, 11*b*, 11*c*, 11*d*, 12*b*, 12*c*, 12*d*, 12*e*, 12*f*, 13, 13*a*, 13*b*, 13*c* side, 21, 21*a* protruding region, 22 airtight space,
- 31 first base layer, 32 second base layer, 33 seal material layer,
- 100,110,11, 120,130 hermetic package device,
- 200 device module, 202 circuit substrate, 206 electronic component,
- $\theta$, $\theta 1$, $\theta 2$, $\theta 3$ angle

The invention claimed is:

1. A hermetic package device, comprising:

a device wafer including, on a mounting surface, a semiconductor circuit and a terminal for electrically connecting the semiconductor circuit and outside;

a lid wafer arranged to face the mounting surface; and a seal portion interposed between the device wafer and the lid wafer, and configured to form an airtight space of a vacuum atmosphere housing the semiconductor circuit between the device wafer and the lid wafer, wherein the device wafer includes a protruding region protruding from the lid wafer in a planar view, the protruding region having a side surface in plan view, the terminal is provided in the protruding region, the seal portion has a polygonal shape in a planar view, and a side of the polygonal shape facing the terminal in the protruding region is provided in a direction different from a crystal orientation of the device wafer and is provided in a direction extending obliquely relative to the side surface of the protruding region in plan view.

2. The hermetic package device according to claim 1, wherein a side of the polygonal shape not facing the protruding region is provided in a direction same as the crystal orientation of the device wafer.

3. The hermetic package device according to claim 1, wherein an angle formed by the side facing the protruding region and the crystal orientation of the device wafer is greater than 0 degrees and 5 degrees or less.

4. The hermetic package device according to claim 1, wherein an angle formed by the side facing the protruding region and the crystal orientation of the device wafer is 1 degree or more and 3 degrees or less.

5. The hermetic package device according to claim 1, wherein the side facing the protruding region includes sides arranged in a V-shape or in a zigzag manner.

6. The hermetic package device according to claim 1, wherein the seal portion includes a first base layer pattern-formed on the mounting surface, a second base layer pattern-formed on a surface of the lid wafer facing the mounting surface, and a seal material layer filling a gap between the first base layer and the second base layer, lead-free solder is used for the seal material layer, and nickel is used for the first base layer and the second base layer.

7. A device module, comprising: a circuit substrate; the hermetic package device according to claim 1, mounted on the circuit substrate; and an electronic component mounted on the circuit substrate and electrically connected to the terminal.

8. The hermetic package device according to claim 1, wherein all sides of the seal portion in plan view extend obliquely relative to all sides of the device wafer in plan view.

9. The hermetic package device according to claim 1, wherein all sides of the seal portion in plan view extend obliquely relative to all sides of the lid wafer in plan view.

10. The hermetic package device according to claim 2, wherein the device wafer does not protrude from the lid wafer at a portion facing to the side of the polygonal shape not facing the protruding region.

11. The hermetic package device according to claim 2, wherein the side of the polygonal shape not facing the protruding region and the side of the polygonal shape facing the protruding region extend obliquely relative to each other in plan view.

12. The hermetic package device according to claim 1, wherein the side of the polygonal shape faces the terminal in the protruding region in a direction extending from the semiconductor circuit toward the terminal.

13. A hermetic package device, comprising:

a device wafer including, on a mounting surface, a semiconductor circuit and a terminal for electrically connecting the semiconductor circuit and outside;

a lid wafer arranged to face the mounting surface; and a seal portion interposed between the device wafer and the lid wafer, and configured to form an airtight space of a vacuum atmosphere housing the semiconductor circuit between the device wafer and the lid wafer, wherein the device wafer includes a protruding region protruding from the lid wafer in a planar view, the terminal is provided in the protruding region, the seal portion has a polygonal shape in a planar view, and a side of the polygonal shape facing the protruding region is provided in a direction different from a crystal orientation of the device wafer, and an angle formed by the side facing the protruding region and the crystal orientation of the device wafer is greater than 0 degrees and 5 degrees or less.

14. The hermetic package device according to claim 13, wherein the angle formed by the side facing the protruding region and the crystal orientation of the device wafer is 1 degree or more and 3 degrees or less.

15. A hermetic package device, comprising:

a device wafer including, on a mounting surface, a semiconductor circuit and a terminal for electrically connecting the semiconductor circuit and outside;

a lid wafer arranged to face the mounting surface; and a seal portion interposed between the device wafer and the lid wafer, and configured to form an airtight space of a vacuum atmosphere housing the semiconductor circuit between the device wafer and the lid wafer, wherein the device wafer includes a protruding region protruding from the lid wafer in a planar view, the terminal is provided in the protruding region, the seal portion has a polygonal shape in a planar view, and a side of the polygonal shape facing the protruding region is provided in a direction different from a crystal orientation of the device wafer, and the seal portion includes a first base layer pattern-formed on the mounting surface, a second base layer pattern-formed on a surface of the lid wafer facing the mounting surface, and a seal material layer filling a gap between the first base layer and the second base layer, lead-free solder is used for the seal material layer, and nickel is used for the first base layer and the second base layer.

* * * * *